US010861672B2

(12) United States Patent
Kozuka

(10) Patent No.: US 10,861,672 B2
(45) Date of Patent: Dec. 8, 2020

(54) APPARATUS FOR MEASURING ION BEAM CURRENT, SAMPLE PREPARATION APPARATUS, AND METHOD OF COMPUTING ION BEAM CURRENT

(71) Applicant: JEOL Ltd., Tokyo (JP)

(72) Inventor: Munehiro Kozuka, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/788,829

(22) Filed: Feb. 12, 2020

(65) Prior Publication Data

US 2020/0266028 A1    Aug. 20, 2020

(30) Foreign Application Priority Data

Feb. 14, 2019    (JP) ................................. 2019-024845

(51) Int. Cl.
*H01J 37/244*    (2006.01)
*H01J 37/24*    (2006.01)

(52) U.S. Cl.
CPC .......... *H01J 37/244* (2013.01); *H01J 37/243* (2013.01)

(58) Field of Classification Search
CPC ........ H01J 37/244; H01J 37/243; H01J 27/08; H01J 2237/30472; H01J 2237/08; H01J 37/24; H01J 37/08; G01R 19/0061

USPC ........................ 250/492.1–492.3, 423 R, 424
See application file for complete search history.

(56) References Cited

U.S. PATENT DOCUMENTS

2013/0313443 A1* 11/2013 Koo ........................ H01J 37/08
                                                                250/427

FOREIGN PATENT DOCUMENTS

JP                  254851 A        2/1990

* cited by examiner

*Primary Examiner* — Michael Maskell
(74) *Attorney, Agent, or Firm* — The Webb Law Firm

(57) ABSTRACT

An apparatus for measuring ion beam current values without disturbing the state of ionization of an ion source includes a high-voltage circuit for applying a voltage between an anode and at least one cathode of an ion source based on a voltage condition and supplying its output current to the anode; a gas flow rate adjusting mechanism for adjusting the flow rate of a gas being an ion source material for generating ions and to be admitted into the ion source; a memory in which there is stored information representing a relationship between the flow rate of the gas and the value of an extraction current flowing through an extraction electrode; and an arithmetic processor for finding the extraction current corresponding to the flow rate of the gas based on the information stored in the memory and subtracting the value of the extraction current from the value of the output current supplied to the anode by the high-voltage circuit to compute the electrical current value of the ion beam.

8 Claims, 9 Drawing Sheets flow rate of the argon gas [sccm]

flow rate of the argon gas [sccm]

APPARATUS FOR MEASURING ION BEAM CURRENT, SAMPLE PREPARATION APPARATUS, AND METHOD OF COMPUTING ION BEAM CURRENT

CROSS-REFERENCE TO RELATED APPLICATION

This application claims priority to Japanese Patent Application No. 2019-024845 filed Feb. 14, 2019, the disclosure of which is hereby incorporated by reference in its entirety.

BACKGROUND OF THE INVENTION

1. Field of the Invention

The present invention relates to an apparatus for measuring ion beam current and also to a sample preparation apparatus. Further, the invention relates to a method of computing ion beam current.

2. Description of the Related Art

Sample preparation apparatus include cross section polishers (CP) for creating cross sections of samples and ion slicers (IS) for creating thin films of samples. A Penning-type ion source is incorporated in each such apparatus. An ion optical system 1 having a cross section polisher (CP) ion source mounted therein is shown in FIG. 2. An ion optical system 2 having an IS ion source mounted therein is shown in FIG. 3. As shown in FIGS. 2 and 3, each ion source 10 is configured including a cylindrical anode 11, a cathode 12, an annular cathode (anticathode) 13, and an annular extraction electrode (ground electrode) 14. The cathodes 12 and 13 are opposite to each other. These electrodes may be shaped differently from this example. The cathode 13 is a polepiece. High-voltage power supplies (high-voltage circuits) 20 and 20A are different in configuration and circuitry between CP and IS.

The electrical current of the ion beam extracted from the ion source 10 is detected as follows. For each of CP and IS, the ion beam is caused to directly impact on a metallic current detection plate 31, and the resulting electrical current through the current detection plate 31 is measured, for example, with an ammeter 33. In order to emit the ion beam appropriately, it is necessary to adjust the flow rate of a gas (which is an ion source material such as Argon gas) to be admitted into the ion source 10. Conventionally, the flow rate of argon gas is set by a human operator who views, on a display screen, the variations in the ion beam current detected by the current detection plate 31 when the flow rate of argon gas is varied.

A conventional control system for the sample preparation apparatus using CP or IS is configured as shown in FIG. 1, which is a block diagram of the conventional control system for the sample preparation apparatus. This control system of FIG. 1 has a user interface section 60, control circuitry 70, an ion source control section 80, and a beam current measuring circuit 30.

The user interface section 60 includes, for example, a high voltage condition setting button 61, a gas flow rate setting button 62, and an ion beam current display portion 63. The control circuitry 70 has an arithmetic processor 72 which controls a high-voltage circuit 81 and a gas flow rate adjusting mechanism 82 of the ion source control section 80, based on the high-voltage application conditions (hereinafter may be referred to as the "high-voltage conditions") received via a display controller 71 and on the setting of the flow rate of the gas being an ion source material.

The value of the ion beam current is a numerical value of the electrical current of the ion beam impinging on a beam current detection unit 53 (corresponding to the current detection plate 31 of FIGS. 2 and 3) within a sample chamber 52, the numerical value being measured by the beam current measuring circuit 30 (corresponding to the ammeter 33 of FIGS. 2 and 3). This numerical value is displayed on the ion beam current display portion 63 of the user interface section 60. The operator sets the ion beam milling conditions by adjusting the argon gas flow rate with the gas flow rate setting button 62 while watching the numerical value. In the sample chamber 52, the ion beam passing through the extraction electrode 14 is made to hit a prepared sample 3, thus milling it.

For example, JP-A-2-54851 discloses that a probe current is controlled by measuring an ion current emitted from an ionized surface having the same current and voltage characteristics as an ionized surface of a field ionization type gas ion source from which the probe current is extracted and by varying the extraction voltage so as to control the value of the emitted ion current.

The conventional method of measuring electrical currents has two main problems. One problem is that an ion beam current is measured at a location different from the sample position. Where the ion beam spreads, scatters, or attenuates, the resulting current measured is not obtained as information contributing actually to milling of the sample.

A second problem is that secondary electrons are generated on the irradiated surface of the current detection plate 31 inserted between the ion source 10 and the sample 3 by irradiating the current detection plate 31 with an ion beam. This creates an electric field distribution where the ion source 10 is at a higher electric potential. As a result, the secondary electrons are caused to return into the ion source 10, varying the state of the plasma in an ionization chamber 51. Insertion of the current detection plate 31 into the optical path of the ion beam disturbs the state of ionization. Consequently, the actual state of the sample during milling cannot be observed. The technique set forth in JP-A-2-54851 also suffers from this problem.

SUMMARY OF THE INVENTION

In view of the foregoing, it is an object of the present invention to provide a technique of computing ion beam current values without disturbing the state of ionization within an ion source.

An ion beam current measuring apparatus according to one aspect of the present invention which achieves the above-described object has: an ion source having an anode, at least one cathode, and an extraction electrode for extracting an ion beam by use of an output current supplied to the anode; a high-voltage circuit for applying a voltage between the anode and the cathode based on a voltage condition and supplying said output current to the anode; a gas flow rate adjusting mechanism for adjusting the flow rate of a gas being an ion source material for generating ions and to be admitted into the ion source; a memory in which there is stored information representing a relationship between the flow rate of the gas being the ion source material and values of an extraction current flowing into the extraction electrode; an arithmetic processor for finding the extraction current corresponding to the flow rate of the gas being the ion source material based on the information stored in the memory and computing the value of electrical current of the ion beam passing through the extraction electrode by subtracting the value of the extraction current from the value of the output current supplied to the anode by the high-voltage circuit; and an output section for producing an output of the electrical current value of the ion beam passing through the extraction electrode computed by the arithmetic processor.

According to at least one aspect of the present invention, the electrical current value of the ion beam can be computed without disturbing the state of ionization within the ion source. Other objects, configurations, and advantageous effects will become apparent from the description of the embodiments described below.

DETAILED DESCRIPTION OF THE INVENTION

Figure 1:
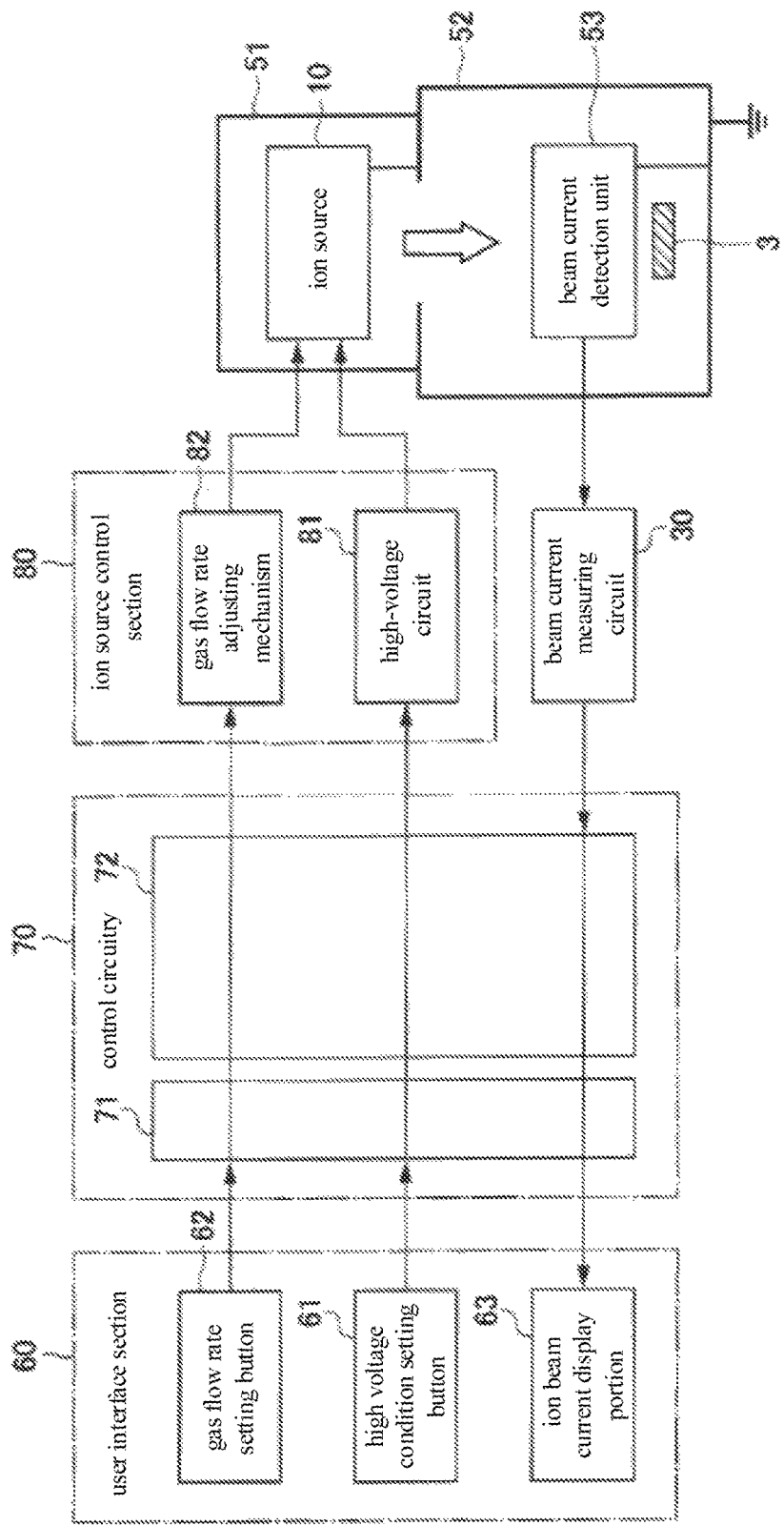
FIG. 1 is a block diagram of a control system of a conventional sample preparation apparatus.

Preferred embodiments of the present invention are hereinafter described with reference to the accompanying drawings. It is to be noted that constituent components having substantially the same function or configuration are indicated by the same reference numerals throughout the present specification and accompanying drawings and a repetition of the description thereof is omitted. An example of configuration of a sample preparation apparatus utilizing the present invention is first described by referring to FIGS. 2 and 3.
<Configuration of Ion Generator of Cross Section Polisher (CP)>

Figure 2:
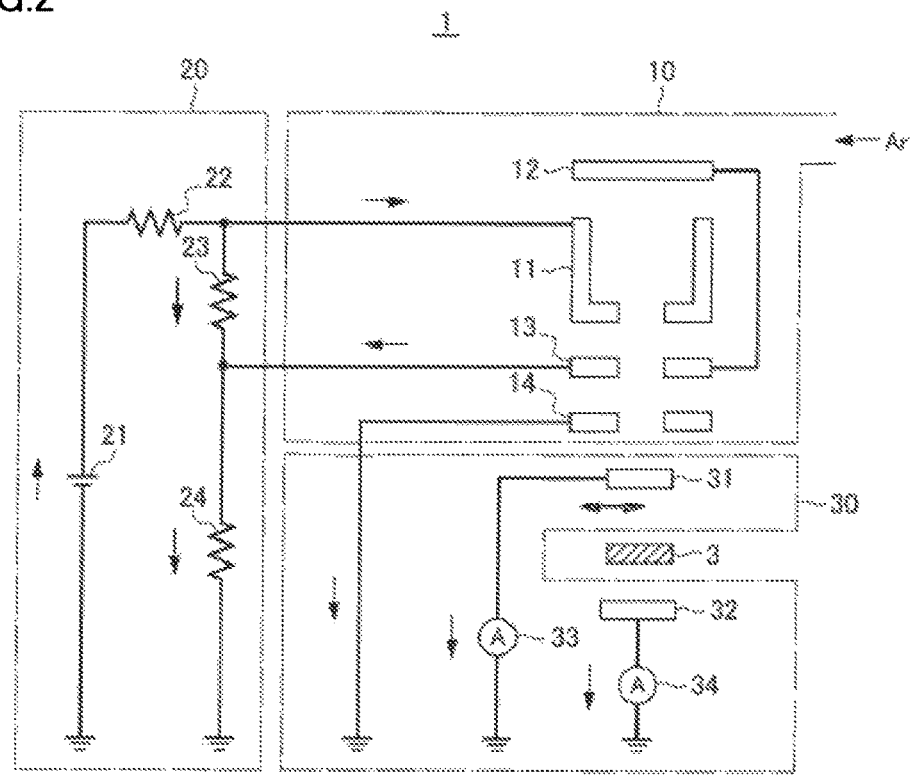
FIG. 2 is a schematic diagram of an ion optical system having a general cross section polisher (CP).

FIG. 2 is a schematic diagram of the ion optical system of the general cross section polisher (CP) which has an ion generator. This ion optical system 1 is an ion milling machine for milling the sample 3 by irradiating it with an ion beam. In the ion milling machine, the state of the ion beam (i.e., ion beam current value) is adjusted by adjusting the flow rate of admitted argon (Ar) gas. The ion optical system 1 is one example of an apparatus for measuring ion beam currents.

The ion optical system 1 includes the ion source 10 for CP, the high-voltage circuit 20, and the beam current measuring circuit 30. The ion source 10 has the anode 11, cathodes 12, 13, and extraction electrode 14 for extracting an ion beam by utilizing its output current supplied to the anode 11. As shown in FIG. 2, for the CP (cross section polisher), the output voltage of a single power supply 21 is divided down by resistors 22-24 such that a potential difference is produced between the anode 11 and the cathodes 12, 13. A gas that is an ion source material such as argon gas is admitted into the ionization chamber 51 (see FIG. 4) in which the ion source 10 is positioned. The ion beam generated in the space formed by the cylindrical anode 11 is extracted by the extraction electrode 14.

In the beam current measuring circuit 30, the electrical current of the ion beam impinging on the current detection plate 31 is measured by the ammeter 33. The ion beam transmitted through the sample 3 is made to impinge on another current detection plate 32, and the current of the impinging ion beam is measured by another ammeter 34. The current detection plate 31 is configured to be capable of being brought into and out of the optical path of the ion beam by a drive mechanism (not shown).

In the present embodiment, when a manual measurement mode (not shown) is selected, the beam current measuring circuit 30 is configured to be able to measure the electrical current value of the ion beam impinging on the current detection plate 31 inserted in the optical path by the use of the ammeter 33. Usually, an automatic measurement mode is active, and control circuitry 70A (see FIG. 4) automatically calculates the electrical current value of the ion beam by a method described later without inserting the current detection plate 31 into the optical path.
<Configuration of Ion Generator of Ion Slicer (IS)>

Figure 3:
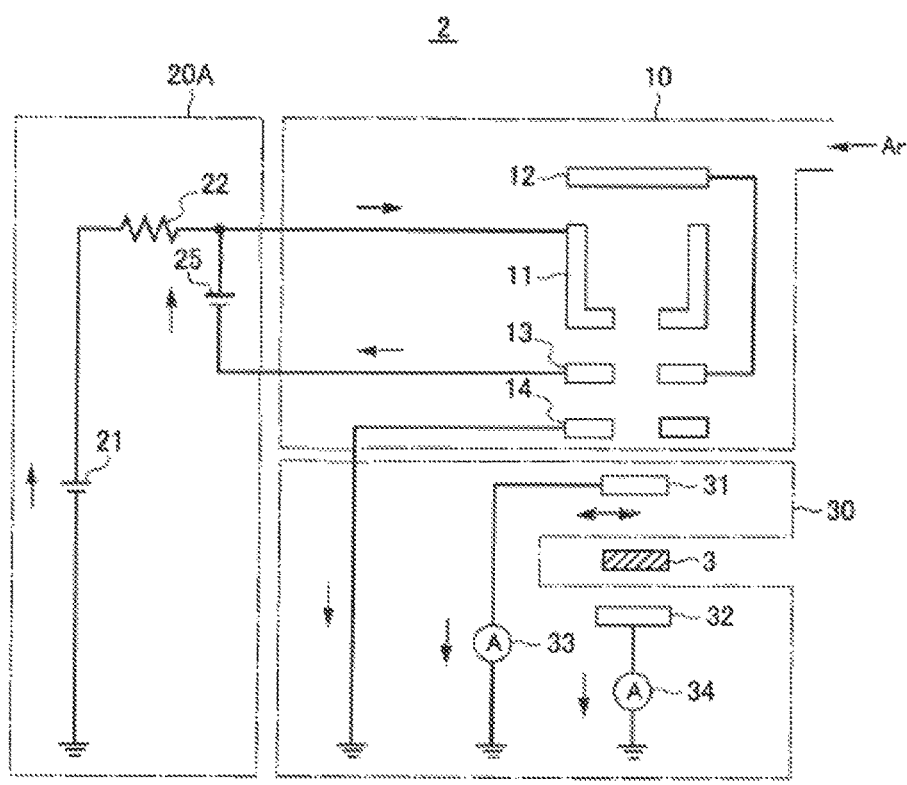
FIG. 3 is a schematic diagram of an ion optical system having a general ion slicer (IS).

FIG. 3 is a schematic diagram of the ion optical system having an ion generator for the general ion slicer (IS). The following description of the ion optical system 2 of FIG. 3 centers on the differences with the ion optical system 1 of FIG. 1. The ion optical system 2 has the IS ion source 10, the high-voltage circuit 20A, and the beam current measuring circuit 30. In the IS, a negative floating power supply 25 is connected to the anode power supply 21 via the resistor 22.

A potential difference is produced between the anode 11 and the cathodes 12 and 13. That is, a dual power supply configuration is provided. The ion optical system 2 is one example of ion beam current measuring apparatus.

SUMMARY OF THE PRESENT INVENTION

We propose a technique of obtaining ion beam current values which provide information actually contributing to milling of a sample from other parameter capable of being measured during the milling in order to compute the ion beam current values without disturbing the state of ionization within the ion source 10.

If a flow of electrical current is noticed and taken as a parameter capable of being measured even during milling of the sample, it is considered that the electrical current of the ion beam impinging on the sample 3 is fundamentally the output current of the high-voltage circuit 81. In the case of the high-voltage circuit 20 (FIG. 2) of the single-power configuration for the CP, an electrical current obtained by subtracting the current flowing into the voltage divider resistor 23 from the output current of the high voltage power supply that supplies the anode voltage corresponds to the ion beam current. On the other hand, in the case of the high-voltage circuit 20A of the dual-power configuration for the IS, the output current of the high voltage power supply that supplies the anode voltage corresponds to the ion beam current.

In either configuration, however, the ion beam current flowing into the extraction electrode 14 at ground potential needs to be taken into consideration in performing the aforementioned subtraction. In practice, however, the extraction electrode 14 is electrically grounded to the sample chamber 52 (see FIG. 4) and so the ion beam current flowing into the extraction electrode 14 is not measured.

In this novel system, the extraction electrode 14 is electrically insulated from the sample chamber (milling chamber) 52. The ion beam current flowing into the extraction electrode 14 was premeasured in practice. We have discovered from the results of the measurements that there is a relationship between the flow rate of argon gas and the ion beam current flowing into the extraction electrode 14.

Since the ion beam current flowing into the extraction electrode 14 indicates that the ion beam has a spread, the relationship is affected by the shapes of the electrodes used in the ion source 10, especially by the diameters of the holes in the electrodes through which the ion beam passes. However, for electrodes having a given shape, if voltages applied to the electrodes are determined, then the ion beam current flowing into the extraction electrode 14 is determined for a given flow rate of argon gas. That is, for voltage conditions of the electrodes, if the relationship of the ion beam current flowing into the extraction electrode 14 to the flow rate of argon gas is stored as a calculation formula or numerical table in the CP or IS instrument (control circuitry), then ion beam currents can be computed and displayed under actual conditions of milling of the sample.

For the sample preparation apparatus of the present embodiment, an electrical current value table defining a relationship of the value of the electrical current flowing into the extraction electrode 14 to the flow rate of argon gas or a calculating formula for the relationship is drawn up in advance. The value of the current through the extraction electrode 14 which satisfies the high voltage conditions set by the operator and corresponds to the set value of the flow rate of argon gas is retrieved from the electrical current value table. Finally, the value of the current through the extraction electrode 14 is subtracted from the measured value of the output current of the high-voltage circuit 81, and the resulting difference is displayed on the user interface section 60 as the value of the current of the ion beam.

First Embodiment

Figure 4:
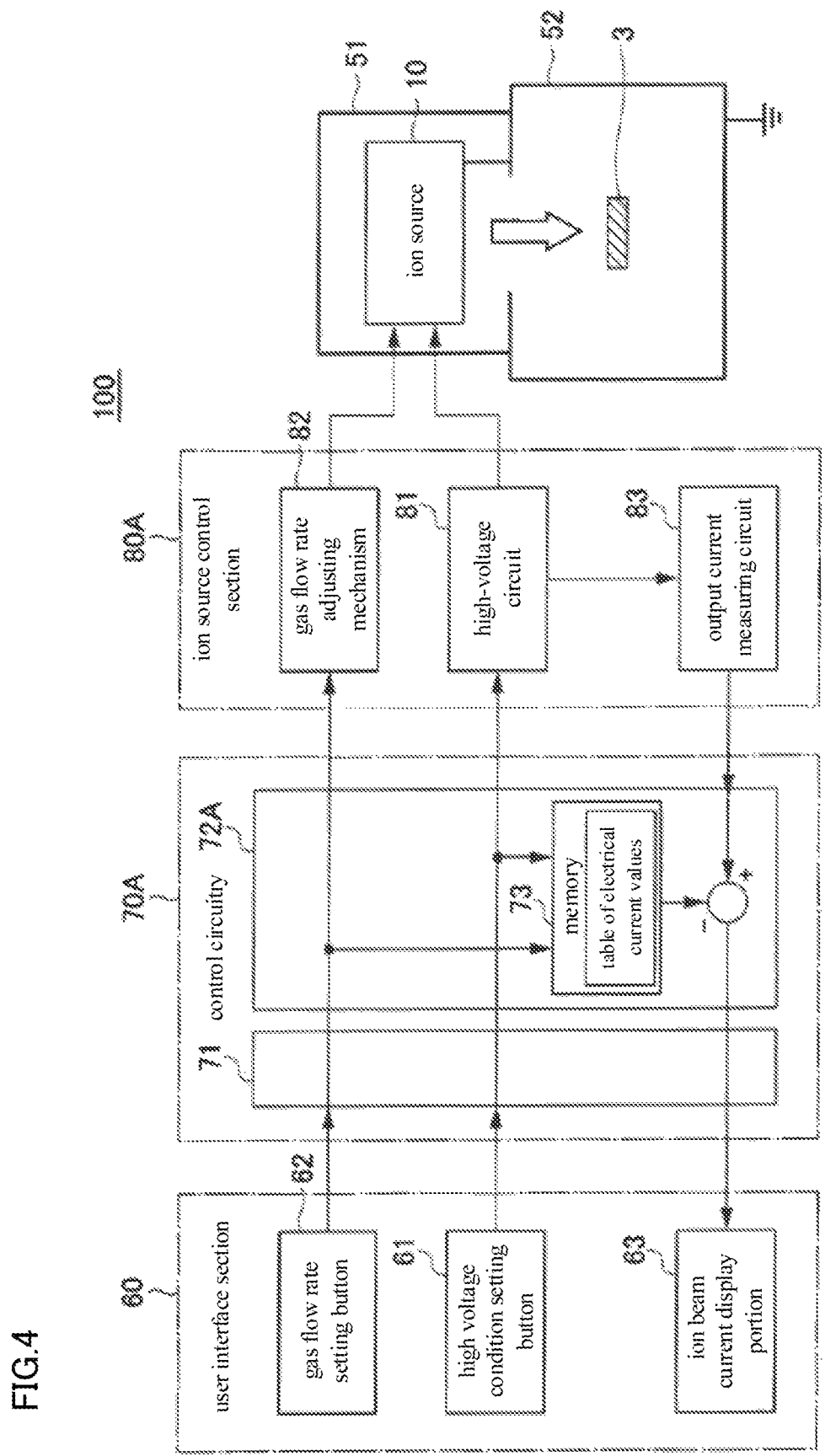
FIG. 4 is a block diagram of a control system for a sample preparation apparatus associated with a first embodiment of the present invention.

The control system of the sample preparation apparatus associated with the first embodiment of the present invention is first described by referring to FIG. 4.

[Control System of Sample Preparation Apparatus]

FIG. 4 is a block diagram of the control system, 100, of the sample preparation apparatus associated with the first embodiment of the present invention. This control system 100 of FIG. 4 can be applied either to the sample preparation apparatus 1 or to the sample preparation apparatus 2. In both FIGS. 1 and 4, those components of the control systems which have substantially the same function or configuration are indicated by the same reference numerals.

The control system 100 of the sample preparation apparatus has an ion source 10, a user interface section 60, control circuitry 70A, and an ion source control section 80A.

The user interface section 60 provides a display of a setting screen for accepting user's input and a monitor screen for monitoring the electrical current value and other values. The user interface section 60 is made of a display device (e.g., a liquid crystal display) and a touch panel for accepting touch input. That is, the user interface section 60 may also be one example of setting portion for setting a high voltage condition and the flow rate of argon gas. Instead of the touch panel, an input device such as a mouse or keyboard may also be used. The user interface section 60 has a high voltage condition setting button 61, a gas flow rate setting button 62, and an ion beam current display portion 63, for example.

The high voltage condition setting button 61 is used by the operator to set a high voltage (a high voltage condition) applied between the anode 11 and the cathodes 12, 13 of the ion source 10. For example, when the high voltage condition setting button 61 is depressed, the currently active screen may go to a high voltage setting condition screen for setting a high voltage condition. Alternatively, the high voltage condition setting button 61 may be a numerical value button, a numerical increment button, a numerical decrement button, or the like.

The gas flow rate setting button 62 is used by the operator to set the flow rate of a gas being an ion source material for generating ions and to be admitted into the ion source 10. In the present embodiment, the gas is argon gas. For example, if the gas flow rate setting button 62 is depressed, the currently active screen may go to a gas flow rate setting screen for setting the flow rate of gas. Alternatively, the gas flow rate setting button 62 may be a numerical value button, a numerical value increment button, a numerical value decrement button, or the like.

The ion beam current display portion 63 provides a display of the electrical current value of the ion beam generated at the ion source 10. The electrical current value of the ion beam computed by the control circuitry 70A is displayed on this display portion 63. In a manual measurement mode, the electrical current value of the ion beam measured with the ammeter 33 can also be displayed.

The control circuitry 70A is composed of the display controller 71 and an arithmetic processor 72A. The display controller 71 (one example of an output section) operates to control the display of the setting screen, monitor screen, or the like on the user interface section 60 and to accept instructions from various setting buttons on the user interface section 60. The display controller 71 outputs the electrical current value of the ion beam computed by the arithmetic processor 72A to the user interface section 60.

The arithmetic processor 72A controls the high-voltage circuit 81 and gas flow rate adjusting mechanism 82 of the ion source control section 80A, based on the high voltage condition received via the display controller 71 and on the set flow rate of the gas being an ion source material. The arithmetic processor 72A has a memory 73 in which a table of extraction electrode current values is stored. The table of the extraction electrode current values may hereinafter be referred to as the "table of electrical current values". The memory 73 is a nonvolatile storage. For example, a semiconductor memory can be used as this memory 73.

The table of the extraction electrode current values contains information representing the relationship between the flow rate of argon gas and values of the extraction current flowing into the extraction electrode 14. The arithmetic processor 72A finds extraction currents corresponding to flow rates of argon gas, based on the information stored in the memory and subtracts the values of the extraction current from the values of output current supplied to the anode 11 from the high-voltage circuit 81 to compute the values of the electrical current of the ion beam passing through the hole in the annular extraction electrode 14. The information representing the relationship between the flow rate of argon gas and the extraction current value may be in the form of a calculation formula.

The ion source control section 80A controls the generation of an ion beam in the ion source 10. The ion source control section 80A has a gas flow rate adjusting mechanism 82, the high-voltage circuit 81, and an output current measuring circuit 83.

The gas flow rate adjusting mechanism 82 operates to adjust the flow rate of a gas (argon gas in the present embodiment) being an ion source material for generating ions and to be admitted into the ion source 10. For example, the adjusting mechanism 82 is built using an actuator and a solenoid valve or the like. A mass flow controller may be used as the gas flow rate adjusting mechanism 82. The high-voltage circuit 81 applies a voltage between the anode 11 and either the cathode 12 or 13 based on a high voltage condition and supplies an output current to the anode 11.

The output current measuring circuit 83 measures the output current delivered to the anode 11 by the high-voltage circuit 81. The output current measuring circuit 83 can be built, for example, by connecting an ammeter (not shown) in series with the power supply 21 or the resistor 24.

[Procedure of Method for Computing Values of Ion Beam Current]

Figure 5:
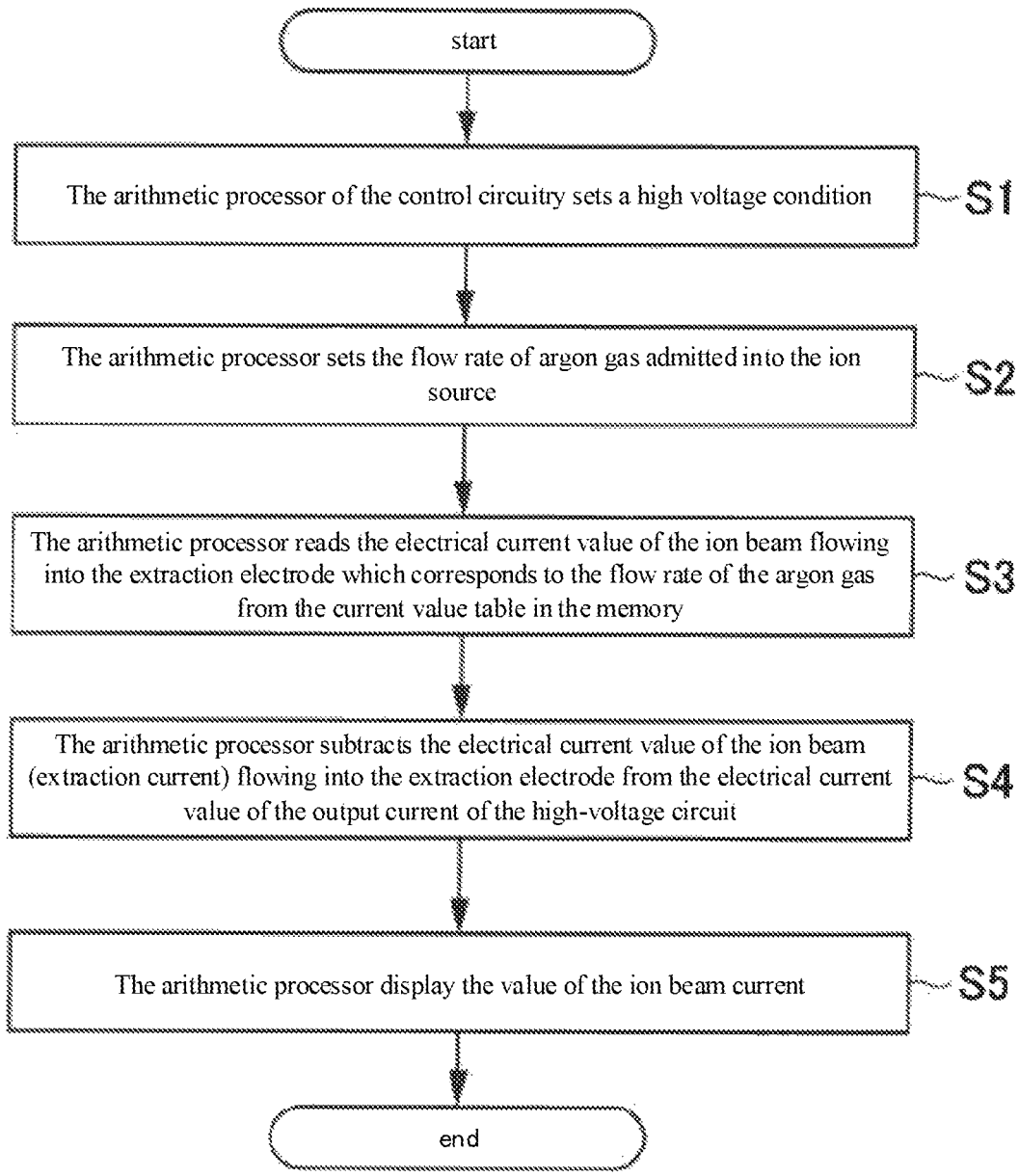
FIG. 5 is a flowchart illustrating an example of a procedure for a method of computing ion beam current values in accordance with the first embodiment.

A procedure of method associated with the first embodiment for computing values of ion beam current is next described by referring to FIG. 5, which is a flowchart illustrating an example of the procedure of method for computing values of ion beam current.

First, the arithmetic processor 72A of the control circuitry 70A sets a high voltage condition based on a setting which is made via the high voltage setting button 61 of the user interface section 60 and entered through the display controller 71, and controls the high-voltage circuit 81A of the ion source control section 80 (S1).

Then, the arithmetic processor 72A sets the flow rate of argon gas admitted into the ion source 10, based on the setting made with the gas flow rate setting button 62 and controls the gas flow rate adjusting mechanism 82 of the ion source control section 80A (S2).

The arithmetic processor 72A then reads the electrical current value of the ion beam flowing into the extraction electrode 14 which corresponds to the flow rate of the argon gas from the current value table in the memory 73 (S3).

The arithmetic processor 72A then subtracts the electrical current value of the ion beam (extraction current) flowing into the extraction electrode 14 from the electrical current value of the output current of the high-voltage circuit 81 measured at this time by the output current measuring circuit 83 to calculate the electrical current value of the ion beam reaching the sample 3 through the extraction electrode 14 (S4).

The arithmetic processor 72A then causes the display controller 71 to display the value of the ion beam current on the ion beam current display portion 63 of the user interface section 60 (S5). After the end of this processing step, the processing sequence illustrated by the flowchart is ended. The output current of the high-voltage circuit 81 is measured regularly or according to operator's instructions. The arithmetic processor 72A executes the processing sequence of step S1-S5 at regular intervals.

[Extraction Current in CP (Cross Section Polisher) and Flow Rate of Argon Gas]

Figure 6:
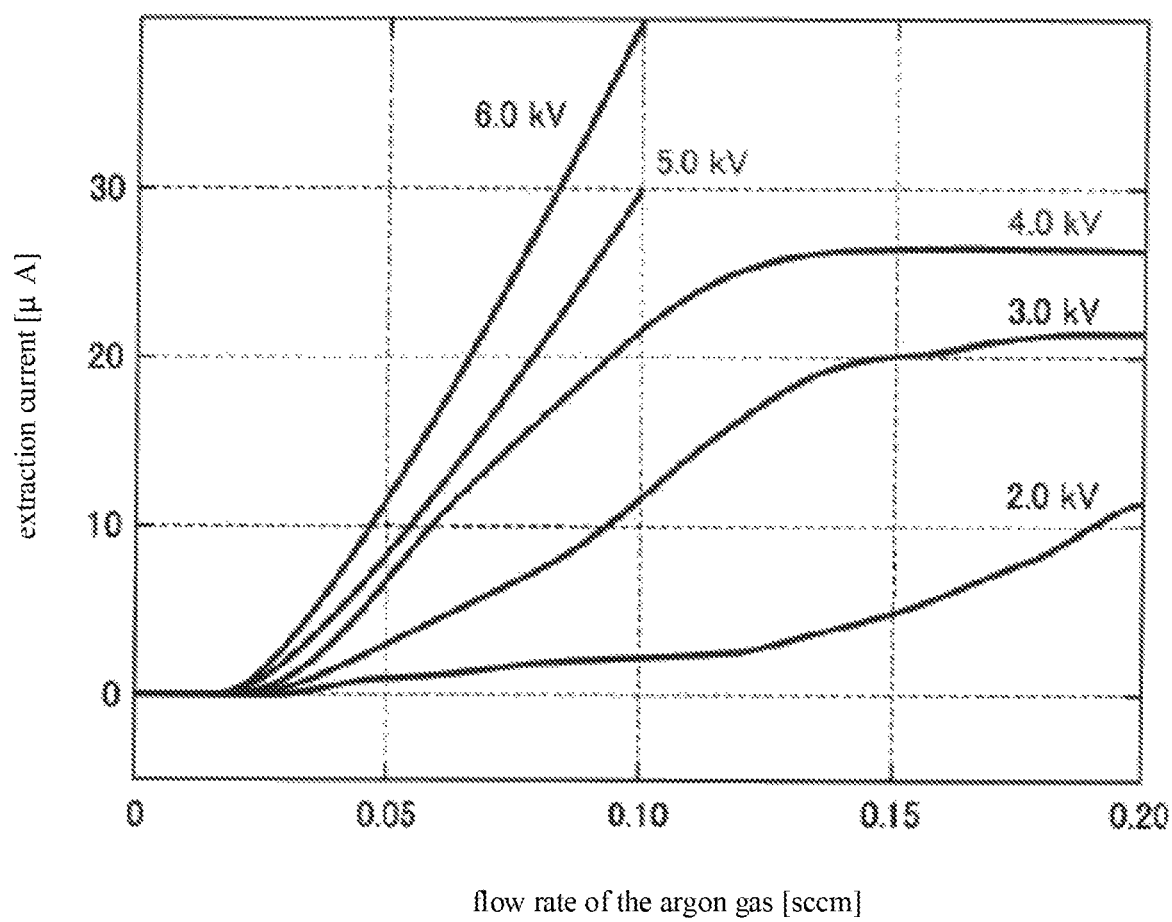
FIG. 6 is a graph showing an example of relationship between the extraction current and the flow rate of argon gas, the relationship being used in a CP (cross section polisher) associated with the first embodiment.

FIG. 6 is a graph showing an example of the relationship between the extraction current in CP associated with the first embodiment and the flow rate of argon gas. In the graph, the horizontal axis indicates the flow rate of argon gas in sccm (standard cc/min) and the vertical axis indicates the extraction current in μA. As shown in FIG. 6, for each different one of high voltages 2.0 kV, 3.0 kV, 4.0 kV, 5.0 kV, and 6.0 kV, the relationship between the extraction current and the flow rate of argon gas is different. As the applied voltage is increased, the electrical current value increases for the same flow rate of argon gas.

A table of electrical current values in which the relationship of the extraction current and flow rate of argon gas is defined is previously stored in the memory 73. Furthermore, it is desirable to prepare a table of electrical current values in which the relationship between the extraction current and flow rate of argon gas is defined, for each different one of such high voltages to be applied and for each different shape of electrode of the ion source 10.

[Various Electrical Currents in CP and Flow Rate of Argon Gas]

Figure 7:
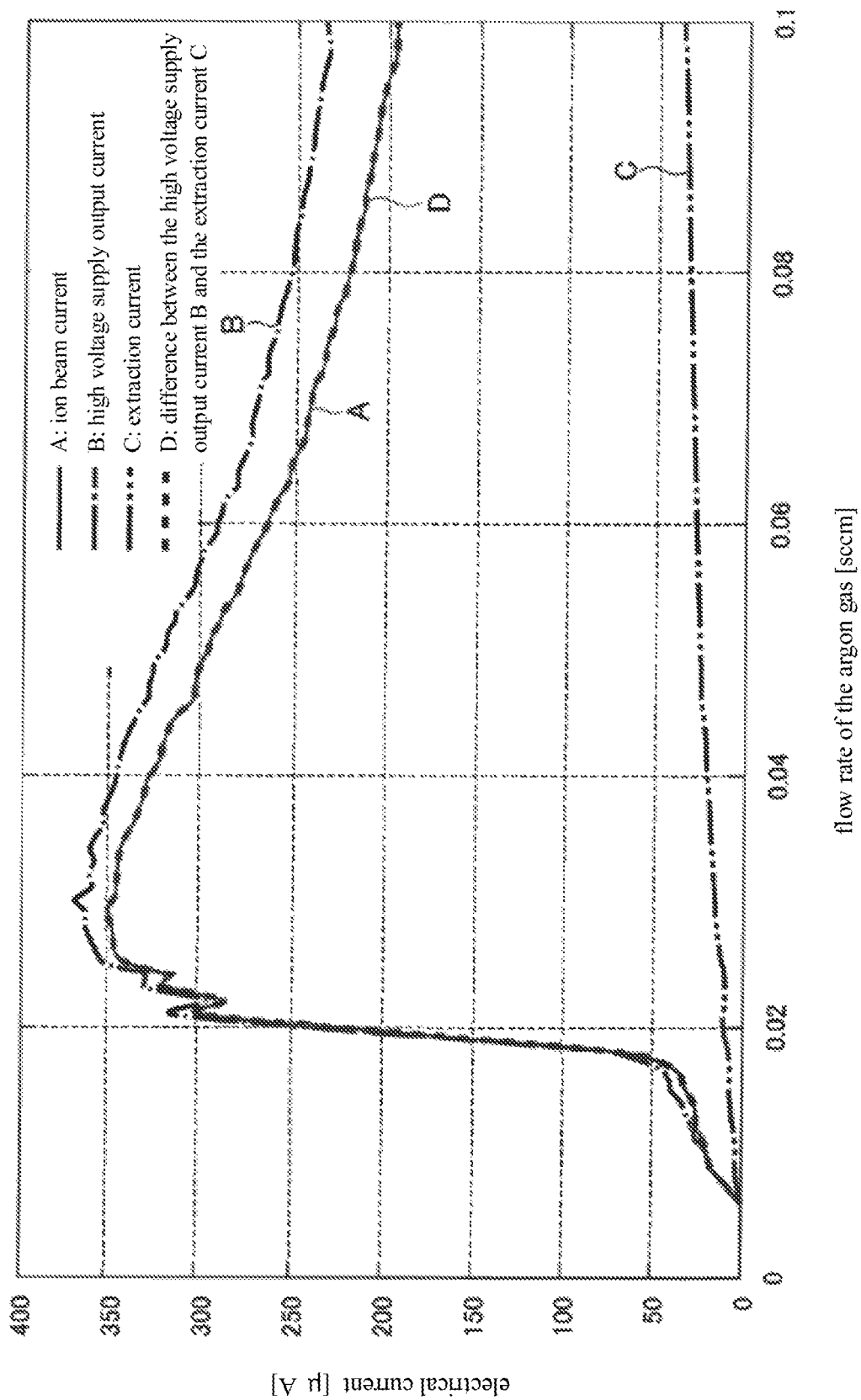
FIG. 7 is a graph showing an example of relationship of various kinds of electrical current and the flow rate of argon gas, the relationship being used in the CP associated with the first embodiment.

FIG. 7 is a graph showing an example of relationship between various electrical currents in CP associated with the first embodiment and the flow rate of argon gas. In the graph, the horizontal axis indicates the flow rate of argon gas in sccm and the vertical axis indicates an electrical current in μA. In FIG. 7, an ion beam current A is denoted by a solid line. A high voltage supply output current B is denoted by a dot-and-dash line. An extraction current C through the extraction electrode is denoted by a double-dot-dash line. The difference between the high voltage supply output current B and the extraction current C through the extraction electrode is indicated by a broken line D. It is seen from FIG. 7 that as the flow rate of argon gas increases, the electrical current value of the extraction current C increases relative to the high voltage supply output current B. It can be confirmed that the difference D between the high voltage supply output current B and the extraction current C flowing into the extraction electrode (i.e., B−C=D) is coincident with the ion beam current A.

[Extraction Current in IS and Flow Rate of Argon Gas]

Figure 8:
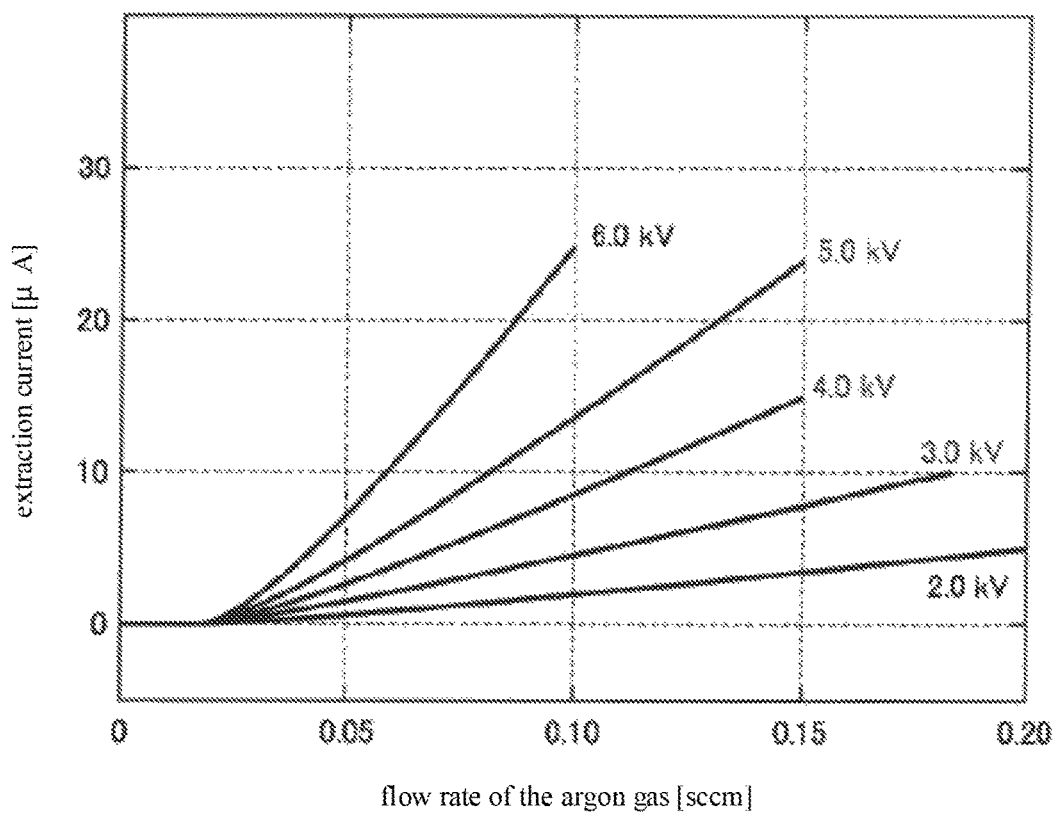
FIG. 8 is a graph showing an example of relationship between the extraction current and the flow rate of argon gas, the relationship being used in an IS (ion slicer) associated with the first embodiment.

FIG. 8 is a graph showing an example of relationship between the extraction current in the IS associated with the first embodiment and the flow rate of argon gas. In the graph, the horizontal axis indicates the flow rate of argon gas in sccm and the vertical indicates the extraction current in μA. In FIG. 8, the relationship between the extraction current and the flow rate of argon gas is different for each different one of high voltages 2.0 kV, 3.0 kV, 4.0 kV, 5.0 kV, and 6.0 kV in the same manner as in the example of CP of FIG. 6. As the applied voltage increases, the electrical current value increases for the same flow rate of argon gas.

[User Interface Screen]

Figure 9:
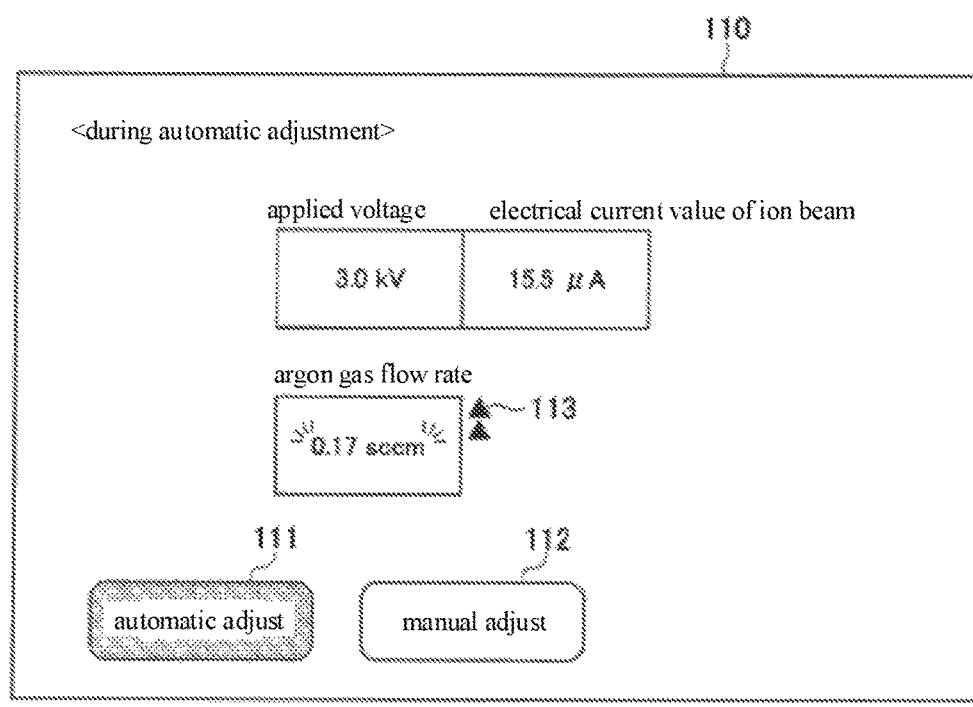
FIG. 9 illustrates one example of user interface screen associated with the first embodiment.

FIG. 9 shows one example of user interface screen associated with the first embodiment. The user interface screen, 110, includes an applied voltage display region, an argon gas flow rate display region, and an ion beam current display region. These display regions permit the operator to confirm the present applied voltage (high voltage condition), argon gas flow rate, and electrical current value of ion beam.

Icons of an automatic adjust button 111 and of a manual adjust button 112 are also displayed on the user interface screen 110. These buttons are used by the operator to select whether the flow rate of argon gas is automatically adjusted by the sample preparation apparatus 1 or 2 or adjusted manually by the operator. If the automatic adjust button 111 is selected as shown in FIG. 7, the arithmetic processor 72A goes to an automatic adjust mode and the automatic adjust button 111 is highlighted (e.g., blinked or displayed in a different color). At the same time, an expression "during automatic adjustment" is displayed at the left top of the user interface screen 110.

In an automatic adjustment mode for the flow rate of argon gas, a display may be provided on the argon gas flow rate display region to permit the operator to check whether the flow rate of argon gas has been adjusted in an increasing or decreasing direction from the previous setting. In FIG. 9, it is clearly shown by two black triangular marks (▲) 113 that an adjustment has been made in an increasing direction. The automatic adjustment mode for the flow rate of argon gas will be described in detail in relation to the second embodiment.

In the above-described first embodiment, ion beam current values can be computed and displayed without using the beam current detection unit 53 which may disturb the state of ionization within the ion source 10. Furthermore, during sample milling, the ion beam can be monitored with the ion beam current display portion 63 in real time.

The ion beam current can be calculated by the use of the high voltage supply output current measuring circuit 83 and the electrical current value table containing the values of current flowing into the extraction electrode 14 or a calculating formula. Therefore, it is not necessary to use an ion beam current detection unit. Furthermore, it is not necessary to insert the current detection plate 31 into the beam path when measuring the ion beam current. Consequently, the ion beam current can be monitored without disturbing the state of ionization within the ion source.

During milling of a sample, the ion beam current can be monitored in real time and, therefore, if the inventive technique is employed for feedback control, optimization of the flow rate of argon gas can be carried out and automated in real time.

By using either the previously prepared data table of the values of electrical current flowing into the extraction electrode 14 or a calculating formula, it is not necessary to measure the electrical current flowing into the extraction electrode 14 while electrically insulating it.

Second Embodiment

A second embodiment of the present invention is so configured that the value of the ion beam current is optimized by feeding the ion beam current value computed by the technique of computation of the first embodiment back to the flow rate of argon gas.

Figure 10:
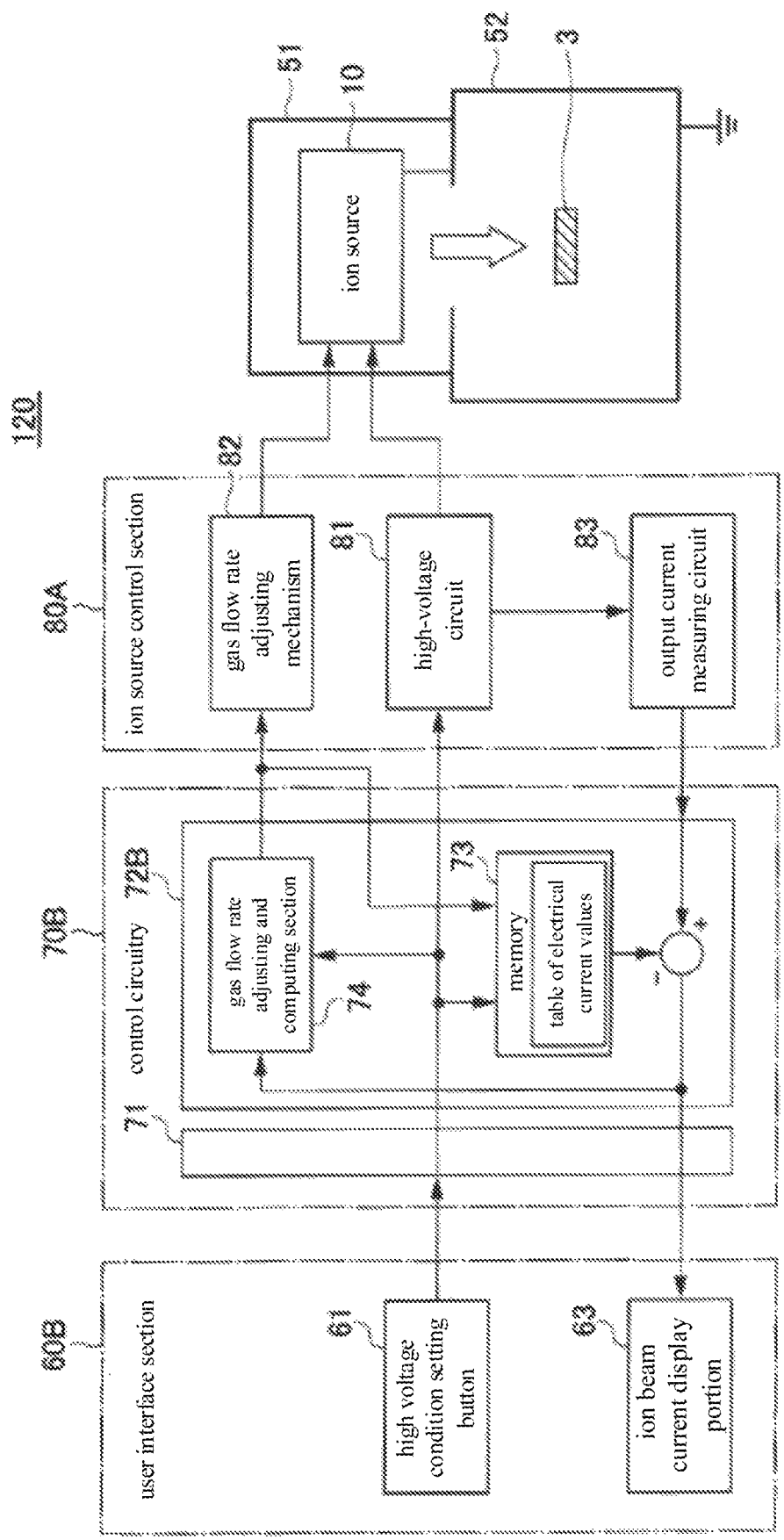
FIG. 10 is a block diagram of a control system for a sample preparation apparatus associated with a second embodiment of the invention.

FIG. 10 is a block diagram of a control system 120 for a sample preparation apparatus associated with the second embodiment. This control system 120 of FIG. 10 has an ion source 10, a user interface section 60B, control circuitry 70B, and an ion source control section 80A. The control system 120 for the sample preparation apparatus is characterized in that an arithmetic processor 72B of the control circuitry 70B has a gas flow rate adjusting and computing section 74 for providing feedback control and that the user interface section 60B does not have the gas flow rate setting button 62.

The arithmetic processor 72B operates to control the high-voltage circuit 81 and the gas flow rate adjusting mechanism 82 based on the setting of the high voltage condition and to control and adjust the flow rate of the argon gas based on the calculated value of ion beam current.

More specifically, the arithmetic processor 72B sets a first flow rate (e.g., an initial value) of argon gas corresponding to a high voltage condition and finds a first electrical current value (initial value) of the extraction current corresponding to the first flow rate of argon gas based on the information (e.g., a table of electrical current values) stored in the memory 73. Then, the arithmetic processor 72B subtracts the first current value of the extraction current from the value (initial value) of the output current supplied to the anode 11 to compute the first electrical current value (initial value) of the ion beam. Then, the processor calculates a second value of the ion beam current corresponding to a second flow rate of argon gas that is varied from the first flow rate of argon gas by a given incremental amount Δ.

The gas flow rate adjusting and computing section 74 of the arithmetic processor 72B calculates the adjusting value of the flow rate of argon gas from the incremental amount of the second current value of the ion beam from the first current value (initial value) of the ion beam and outputs the calculated adjusting value to the gas flow rate adjusting mechanism 82.

Figure 11:
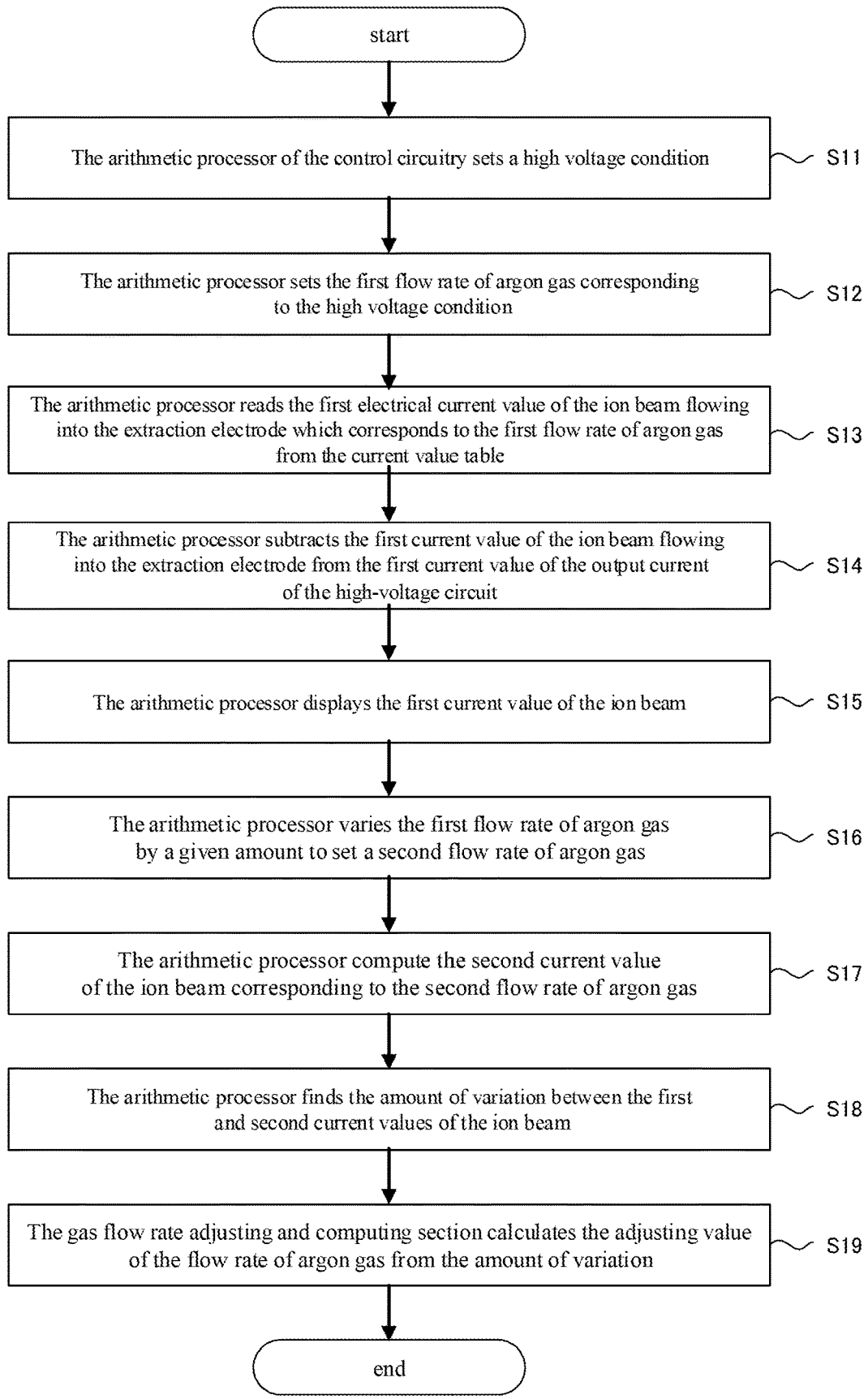
FIG. 11 is a flowchart illustrating an example of a procedure for a method of computing ion beam current values in accordance with the second embodiment.

A procedure of the method for computing ion beam current values associated with the second embodiment is next described by referring to FIG. 11, which is a flowchart illustrating an example of the procedure of the method for computing ion beam current values.

First, the arithmetic processor 72B of the control circuitry 70B sets a high voltage condition based on the setting which is made via the high voltage condition setting button 61 of the user interface section 60B and which is entered through the display controller 71, and controls the high-voltage circuit 81 of the ion source control section 80A (S11).

Then, the arithmetic processor 72B sets the first flow rate of argon gas corresponding to the high voltage condition and controls the gas flow rate adjusting mechanism 82 of the ion source control section 80A (S12). In the present embodiment, information in the form of a data table, a calculation formula, or the like and defining a relationship between the high voltage condition and the flow rate of argon gas is previously stored in the memory 73.

Then, the arithmetic processor 72B reads the first electrical current value of the ion beam flowing into the extraction electrode 14 which corresponds to the first flow rate of argon gas from the current value table in the memory 73 (S13).

Then, the arithmetic processor 72B subtracts the first current value of the ion beam (extraction current) flowing into the extraction electrode 14 from the first current value of the output current of the high-voltage circuit 81 measured by the output current measuring circuit 83 at this time to calculate the first current value of the ion beam reaching the sample 3 through the extraction electrode 14 (S14).

The arithmetic processor 72B then displays the first current value of the ion beam on the ion beam current display portion 63 of the user interface section 60B via the display controller 71 (S15).

The arithmetic processor 72B then varies the first flow rate of argon gas by a given amount to set a second flow rate of argon gas (S16).

The arithmetic processor 72B then performs a processing sequence similar to the processing sequence of steps S12-S14 to compute the second current value of the ion beam corresponding to the second flow rate of argon gas (S17).

The gas flow rate adjusting and computing section 74 of the arithmetic processor 72B then finds the amount of variation between the first and second current values of the ion beam (S18). The gas flow rate adjusting and computing section 74 calculates the adjusting value of the flow rate of argon gas from the amount of variation (S19).

The calculated adjusting value of the flow rate of argon gas is entered into the gas flow rate adjusting mechanism 82. The adjusting mechanism 82 adjusts the flow rate of argon gas admitted into the ion source 10 based on the entered adjusting value of the flow rate of argon gas. The gas flow rate adjusting and computing section 74 outputs the calculated adjusting value of the flow rate of argon gas to the user interface section 60B and displays the flow rate of argon gas on the user interface screen 110.

After the end of this processing step, the processing sequence illustrated by the flowchart is ended. The output current of the high-voltage circuit 81 is measured at regular intervals or in response to operator's instructions. The processing sequence of steps S11-S19 is carried out regularly. The output current of the high-voltage circuit 81 is measured regularly. The arithmetic processor 72B carries out the processing sequence of steps S11-S19 regularly.

For example, for the first flow rate F1 (initial value) of argon gas, the first current value I1 of the ion beam is found. For the second flow rate F2 (=F1+ΔF) greater than the first flow rate F1 of argon gas, the second current value I2 of argon gas is found. Where the second current value I2 of ion beam is smaller than the first current value I1, deviates away from a peak value (350 µA in FIG. 7), and is in the neighborhood of 300 µA, for example, the adjusting value of the flow rate of argon gas is set smaller than the first flow rate F1 (for example, F1−ΔF). Consequently, the electrical current value of the ion beam impinging on the sample 3 can be brought close to an optimum value (e.g., a peak value).

The above-described second embodiment yields advantageous effects similar to those produced by the first embodiment. Furthermore, in the second embodiment, the ion beam current can be monitored in real time while the sample is being milled. Hence, optimization of the flow rate of argon gas can be carried out and automated in real time by providing feedback control through the gas flow rate adjusting and computing section 74.

<Others>

In the first and second embodiments described above, the relationship between the flow rate of argon gas and the electrical current flowing into the extraction electrode 14 is stored as numerical values (table of electrical current values) in a memory. Instead of an electrical current value table, a calculation formula may be used.

The present invention is also applicable to a sample preparation apparatus such as an ion milling machine used to prepare a sample observed or analyzed with an electron microscope, electron probe microanalyzer (EPMA), Auger microprobe, or the like. Furthermore, the invention can be applied to an ion beam generator having an electrode structure similar to the ion source 10 as well as a high-voltage circuit.

It is to be understood that the present invention is not restricted to the foregoing embodiments and that the invention can be practiced, of course, in variously modified forms without departing from the gist of the invention delineated by the appended claims.

For example, in the foregoing embodiments, the configuration of the sample preparation apparatus has been described in detail using specific terms to explain the present invention in an easily understandable manner. The invention is not restricted to an apparatus having all of the constituent elements described above. Furthermore, some configurations of some embodiment may be replaced by some configurations of other embodiment. Additionally, constituent elements of other embodiment may be added to the configuration of some embodiment. Further, with respect to some configurations of each embodiment, other constituent elements may be added, deleted, or replaced.

In addition, the above-described configurations, functions, processors, and so on may be implemented in hardware by designing some or all of them using an integrated circuit, for example. Further, the above-described constituent elements, functions, and so on may be implemented in software by causing a processor such as a CPU to interpret and execute programs performing their functions. Information about programs, data tables, files, and so on for realizing functions can be stored in a storage device such as a semiconductor memory, hard disk, or SSD (solid state drive) or a magnetic or optical storage medium.

What is claimed is:

1. An ion beam current measuring apparatus comprising:
an ion source having an anode, at least one cathode, and an extraction electrode for extracting an ion beam by use of an output current supplied to the anode;
a high-voltage circuit for applying a voltage between the anode and the cathode based on a voltage condition and supplying said output current to the anode;
a gas flow rate adjusting mechanism for adjusting a flow rate of a gas being an ion source material for generating ions and to be admitted into the ion source;
a memory in which there is stored information representing a relationship between the flow rate of the gas being the ion source material and values of an extraction current flowing into the extraction electrode;
an arithmetic processor for finding the extraction current corresponding to the flow rate of the gas being the ion source material based on the information stored in the memory and computing a value of electrical current of the ion beam passing through the extraction electrode by subtracting the value of the extraction current from a value of the output current supplied to the anode by the high-voltage circuit; and
an output section for producing an output of the value of the electrical current of the ion beam passing through the extraction electrode computed by the arithmetic processor.

2. An ion beam current measuring apparatus according to claim 1, further comprising a setting section for setting said voltage condition and the flow rate of said gas being the ion source material;
wherein said arithmetic processor operates to control said high-voltage circuit and said gas flow rate adjusting mechanism, based on said voltage condition and the setting of the flow rate of said gas being the ion source material.

3. An ion beam current measuring apparatus according to claim 1, further comprising a setting section for setting said voltage condition;
wherein said arithmetic processor performs a control operation for controlling said high-voltage circuit and said gas flow rate adjusting mechanism based on the setting of said voltage condition and another control operation for adjusting the flow rate of said gas being the ion source material based on the computed value of the electrical current of the ion beam.

4. An ion beam current measuring apparatus according to claim 3, wherein said control operation performed by said arithmetic processor for adjusting the flow rate of said gas being the ion source material comprises the steps of:

setting a first flow rate of said gas being the ion source material in accordance with said voltage condition;

finding a first current value of said extraction current corresponding to the first flow rate of said gas being the ion source material, based on said information stored in said memory;

subtracting the first current value of the extraction current from the value of said output current supplied to said anode to compute a first current value of the ion beam;

then computing a second current value of the ion beam corresponding to the second flow rate of said gas being the ion source material which is varied from the first flow rate of the gas by a given amount; and computing an adjusting value of the flow rate of the gas being the ion source material from the amount of variation between the second current value of the ion beam and the first current value of the ion beam.

5. An ion beam current measuring apparatus as according to claim 1, wherein the information stored in said memory is in the form of a data table defining a relationship between the flow rate of said gas being the ion source material and the value of the extraction current flowing into said extraction electrode.

6. An ion beam current measuring apparatus according to claim 1, wherein the information stored in said memory is in the form of a calculation formula defining a relationship between the flow rate of said gas being the ion source material and the value of the extraction current flowing into said extraction electrode.

7. A sample preparation apparatus comprising:
an ion source having an anode, at least one cathode, and an extraction electrode for extracting an ion beam by use of an output current supplied to the anode;
a high-voltage circuit for applying a voltage between the anode and the cathode based on a voltage condition and supplying said output current to the anode;
a gas flow rate adjusting mechanism for adjusting a flow rate of a gas being an ion source material for generating ions and to be admitted into the ion source;
a memory in which there is stored information representing a relationship between the flow rate of the gas being the ion source material and values of the extraction current flowing into the extraction electrode;
an arithmetic processor for finding an extraction current corresponding to the flow rate of the gas being the ion source material based on the information stored in the memory and computing a value of electrical current of an ion beam passing through the extraction electrode by subtracting the value of the extraction current from a value of the output current supplied to the anode by the high-voltage circuit;
an output section for producing an output of the value of the electrical current of the ion beam passing through the extraction electrode computed by the arithmetic processor; and
a milling chamber in which a prepared sample is irradiated with the ion beam passed through the extraction electrode to mill the sample.

8. A method of computing an ion beam current directed at a sample by a sample preparation apparatus comprising: an ion source having an anode, at least one cathode, and an extraction electrode for extracting an ion beam by use of an output current supplied to the anode; a high-voltage circuit for applying a voltage between the anode and the cathode based on a voltage condition and supplying said output current to the anode; a gas flow rate adjusting mechanism for adjusting a flow rate of a gas being an ion source material for generating ions and to be admitted into the ion source; and an arithmetic processor;
wherein the arithmetic processor finds the extraction current corresponding to the flow rate of the gas being the ion source material based on information representing a relationship between the flow rate of the gas being the ion source material and the value of the extraction current flowing into the extraction current; and
wherein the high-voltage circuit subtracts the value of the extraction current from the value of the output current supplied to the anode to compute an electrical current value of the ion beam passing through the extraction electrode.

* * * * *